United States Patent
Wehlus

(10) Patent No.: US 9,941,487 B2
(45) Date of Patent: Apr. 10, 2018

(54) GLASS ITEM, GLASS ITEM HAVING LUMINESCENT-SUBSTANCE PARTICLES, DEVICE FOR PRODUCING A GLASS ITEM, METHOD FOR PRODUCING A GLASS ITEM, AND METHOD FOR PRODUCING A GLASS ITEM HAVING LUMINESCENT-SUBSTANCE PARTICLES

(71) Applicant: OSRAM OLED GmbH, Regensburg (DE)

(72) Inventor: Thomas Wehlus, Lappersdorf (DE)

(73) Assignee: OSRAM OLED GmbH, Regensburg (DE)

( * ) Notice: Subject to any disclaimer, the term of this patent is extended or adjusted under 35 U.S.C. 154(b) by 25 days.

(21) Appl. No.: 15/118,913

(22) PCT Filed: Feb. 12, 2015

(86) PCT No.: PCT/EP2015/052954
§ 371 (c)(1),
(2) Date: Aug. 15, 2016

(87) PCT Pub. No.: WO2015/124489
PCT Pub. Date: Aug. 27, 2015

(65) Prior Publication Data
US 2016/0365541 A1    Dec. 15, 2016

(30) Foreign Application Priority Data

Feb. 21, 2014    (DE) .................. 10 2014 102 256

(51) Int. Cl.
*H01L 51/52*    (2006.01)
*C03C 14/00*    (2006.01)
(Continued)

(52) U.S. Cl.
CPC .......... *H01L 51/5268* (2013.01); *C03B 5/173* (2013.01); *C03C 11/00* (2013.01);
(Continued)

(58) Field of Classification Search
CPC .................................................... C03C 14/004
See application file for complete search history.

(56) References Cited

U.S. PATENT DOCUMENTS

2005/0069254 A1    3/2005    Schultheis et al.
2006/0043345 A1*   3/2006    Tanaka ..................... C03C 8/14
                                                                252/512

(Continued)

FOREIGN PATENT DOCUMENTS

DE    102011078663 A1    1/2013
DE    102012206967 A1    10/2013
(Continued)

OTHER PUBLICATIONS

International Search Report based on Application No. PCT/EP2015/052954 (4 Pages and 3 Pages of English translation) dated May 26, 2015 (Reference Purpose Only).
(Continued)

*Primary Examiner* — David Sample
(74) *Attorney, Agent, or Firm* — Viering, Jentschura & Partner mbB

(57) ABSTRACT

In various embodiments, glassware is provided. The glassware may include a glass matrix having a surface, a first type of particles, and at least one second type of particles, wherein the particles of the second type have a higher refractive index than the particles of the first type, wherein the particles of the first type are completely surrounded by the glass matrix, such that the surface of the glass matrix is free of particles of the first type, and the particles of the second type are arranged above and/or between the particles (Continued)

of the first type at least partly in the glass matrix at the surface of the glass matrix in order to increase the refractive index of the glassware.

14 Claims, 3 Drawing Sheets

(51) Int. Cl.
    *H01L 51/56*     (2006.01)
    *C03C 13/04*     (2006.01)
    *C03B 5/173*     (2006.01)
    *C09K 11/02*     (2006.01)
    *C03C 11/00*     (2006.01)
    *H01L 33/50*     (2010.01)

(52) U.S. Cl.
    CPC ............ *C03C 13/04* (2013.01); *C03C 14/004* (2013.01); *C03C 14/006* (2013.01); *C09K 11/025* (2013.01); *H01L 51/56* (2013.01); *C03C 2213/00* (2013.01); *C03C 2214/04* (2013.01); *C03C 2214/16* (2013.01); *C03C 2214/34* (2013.01); *H01L 33/501* (2013.01)

(56) References Cited

U.S. PATENT DOCUMENTS

| | | | | |
|---|---|---|---|---|
| 2008/0084150 A1* | 4/2008 | Cok | ............ | B82Y 20/00 313/110 |
| 2009/0173957 A1* | 7/2009 | Brunner | ............ | C09K 11/7701 257/98 |
| 2009/0272996 A1* | 11/2009 | Chakraborty | ......... | H01L 33/501 257/98 |
| 2011/0001159 A1 | 1/2011 | Nakamura et al. | | |
| 2012/0107622 A1* | 5/2012 | Borrelli | ..................... | C03C 8/04 428/428 |
| 2012/0313134 A1 | 12/2012 | Vermersch et al. | | |
| 2013/0334957 A1 | 12/2013 | Beckers et al. | | |
| 2014/0127464 A1 | 5/2014 | Eberhardt et al. | | |
| 2014/0177241 A1 | 6/2014 | Ohta et al. | | |
| 2014/0246689 A1* | 9/2014 | Luo | ........................ | H01L 33/504 257/98 |
| 2015/0097165 A1 | 4/2015 | Setz et al. | | |
| 2015/0228869 A1* | 8/2015 | Yoo | ........................ | H01L 33/54 362/97.3 |
| 2015/0243923 A1 | 8/2015 | Reusch et al. | | |
| 2016/0027971 A1* | 1/2016 | Anc | ..................... | C09K 11/025 257/98 |
| 2016/0312118 A1* | 10/2016 | Fiedler | ............... | C09K 11/7728 |

FOREIGN PATENT DOCUMENTS

| | | |
|---|---|---|
| DE | 102012109258 A1 | 4/2014 |
| EP | 2541286 A1 | 1/2013 |
| JP | H11194204 A | 7/1999 |
| WO | 2013021922 A1 | 2/2013 |

OTHER PUBLICATIONS

German Search Report based on Application No. 10 2014 102 256.4(8 Pages) dated Sep. 15, 2014 (Reference Purpose Only).
German Office Action based on application No. 10 2014 102 256.4 (6 pages) dated Oct. 10, 2017 (Reference Purpose Only).

* cited by examiner

GLASS ITEM, GLASS ITEM HAVING LUMINESCENT-SUBSTANCE PARTICLES, DEVICE FOR PRODUCING A GLASS ITEM, METHOD FOR PRODUCING A GLASS ITEM, AND METHOD FOR PRODUCING A GLASS ITEM HAVING LUMINESCENT-SUBSTANCE PARTICLES

RELATED APPLICATIONS

The present application is a national stage entry according to 35 U.S.C. § 371 of PCT application No.: PCT/EP2015/052954 filed on Feb. 12, 2015, which claims priority from German application No.: 10 2014 102 256.4 filed on Feb. 21, 2014, and is incorporated herein by reference in its entirety.

TECHNICAL FIELD

In various embodiments, glassware, glassware including luminophore particles, a device for producing glassware, a method for producing glassware, and a method for producing glassware including luminophore particles are provided.

BACKGROUND

Optoelectronic components on an organic basis, for example organic light emitting diodes (OLEDs), are being increasingly widely used in general lighting, for example as a surface light source.

An organic optoelectronic component, for example an OLED, may include on a carrier an anode and a cathode with an organic functional layer system therebetween. The organic functional layer system may include one or a plurality of emitter layer(s) in which electromagnetic radiation is generated, one or a plurality of charge generating layer structure(s) each composed of two or more charge generating layers (CGL) for charge generation, and one or a plurality of electron blocking layers, also designated as hole transport layer(s) (HTL), and one or a plurality of hole blocking layers, also designated as electron transport layer(s) (ETL), in order to direct the current flow.

A current flow between the electrodes leads to the generation of electromagnetic radiation in the organic functional layer system. The electromagnetic radiation can be extracted from the OLED by means of total internal reflection within the components normally only to the extent of ~20% without technical aids. The total internal reflection in the OLED can be reduced by means of the use of scattering layers, for example with a scattering layer between the first electrode and the carrier. A higher proportion of the generated electromagnetic radiation, for example light, can be extracted as a result.

In a conventional scattering layer, an organic matrix is used (as a result of which said scattering layer is also designated as an organic scattering layer), in which scattering centers having a different refractive index than the organic matrix are embedded. However, upon contact with water and/or oxygen, organic scattering layers can age or degrade and thus reduce the stability of an OLED. A further disadvantage of organic scattering layers is their low refractive index (n~1.475). Since the organic functional layer structure usually has a layer-thickness-averaged refractive index of approximately 1.7, with the low refractive index of the organic scattering layers this results in moderate angles of incidence for the criterion of total internal reflection at the interface between the first electrode and the scattering layer, such that the extraction efficiency is moderate.

Furthermore, conventional practice involves cleaning the carrier before forming the scattering layer and cleaning the carrier with scattering layer before forming the first electrode, as a result of which the production method for forming the optoelectronic component becomes more time- and cost-intensive.

Furthermore, conventional organic scattering layers can be readily susceptible to mechanical abrasion on account of the interface between the carrier and the scattering layer. The organic scattering layer can furthermore be damaged in subsequent coating and/or cleaning processes, for example by solvents.

Furthermore, scattering layers composed of high refractive index glass solder with embedded scattering centers are known. The number density of the scattering centers in these scattering layers decreases from the interior to the surface toward the outside or is homogeneous in the layer cross section. Said layer cross section results from the conventional method for producing the layers that are formed from a suspension, or a paste including scattering centers and matrix substance, for example glass solder. However, the roughness of the scattering layer or the form of the scattering centers can lead to the formation of spikes at the scattering layer surface. With the use of scattering particles as scattering centers, scattering particles not completely enclosed by glass at the scattering layer surface can likewise form spikes. Spikes should be understood as local surface rougenings having a high aspect ratio. Particularly in the case of a thin configuration of an OLED, spikes can lead to the first electrode being short-circuited with the second electrode. In addition, during the production of the OLED in direct proximity to the spikes of the scattering layer a local distortion or decrosslinking of the layers on or above the scattering layer can occur, for example of the first electrode or of the organic functional layer. If a thin film encapsulation is applied on the component, then by means of the spikes there is the risk of the thin film encapsulation not being impermeable locally, which can lead to the degradation of the component.

The surface properties of scattering layers, for example a low surface roughness or a defined undulation, are conventionally set by means of a glass layer additionally applied to the scattering layer. This also reduces the risk of scattering particles not completely enclosed by glass being present at the surface of the scattering layer. However, the additional layer usually requires an additional heat treatment step and thus prolongs the process implementation. Furthermore, such a method has the disadvantage that refractive index-changing substances cannot be arranged at the surface of the scattering layer in a controlled manner.

Furthermore, one conventional method is known in which particles are applied to a glass ribbon of float glass while the glass is still hot, such that particles partly sink into the float glass or react chemically therewith. This has the disadvantage, however, that particles of a number of sizes are applied jointly, which can lead to problems mentioned above. In particular, the surface quality (roughness) of the glass can thereby deteriorate since particles cannot be applied in a defined manner and can project in part from the surface.

SUMMARY

In various embodiments, glassware, glassware including luminophore particles, a device for producing glassware, a method for producing glassware, and a method for producing glassware including luminophore particles are provided which make it possible, for example, to form the extraction structure and/or coupling-in structure of an optoelectronic component during the process for producing the carrier and/or the cover of the optoelectronic component.

In various embodiments, glassware is provided. The glassware may include a glass matrix having a surface, a first type of particles, and at least one second type of particles. The particles of the second type can have a higher refractive index than the particles of the first type; wherein the particles of the first type are completely surrounded by the glass matrix, such that the surface of the glass matrix is free of particles of the first type, and the particles of the second type are arranged above and/or between the particles of the first type at least partly in the glass matrix at the surface of the glass matrix in order to increase the refractive index of the glassware, for example in the region of the surface or at the surface of the glassware.

In various configurations, reference is made to an electromagnetic radiation, for example with regard to optical properties of the particles and glass matrix. Electromagnetic radiation should be understood to mean at least one wavelength range of the electromagnetic radiation which is incident on the glassware, for example is transmitted or reflected by the glassware.

In one configuration of the glassware, the glassware can be formed such that it is at least translucent in the visible wavelength range of an electromagnetic radiation, for example transparent, for example colored.

In one configuration of the glassware, the glassware can be formed as a flat glass, for example as a carrier, a cover, a window, a pane or a planar optical waveguide; for example as a carrier and/or cover of an organic light emitting diode, of a solar cell, or as optical waveguide of a backlighting unit of a display.

In one configuration of the glassware, the glassware can be formed as a hollow glass, for example as a glass tube or glass bulb; for example as a glass bulb of an incandescent lamp or glass tube of a fluorescent lamp.

In one configuration of the glassware, the glassware can be formed as a glass fiber, for example as glass wool or an optical waveguide.

In one configuration of the glassware, the glass matrix can be or include a metallic glass; for example a metallic alloy in the eutectic. The metallic glass can also be formed on a metal of the same material composition. The particles can furthermore prevent a crystallization of the metal or a cracking in the metal.

In one configuration of the glassware, the surface can have a root mean square (RMS) roughness that is less than approximately 10 nm, for example in a range of approximately 0.1 nm to approximately 8 nm.

In one configuration of the glassware, the surface may include in an exposed fashion a portion of the particles of the second type and of the glass matrix. As a result, it is possible to vary the refractive index close to the surface.

In one configuration of the glassware, the first type of particles and/or the second type of particles can in each case have a refractive index in a range of approximately 1.5 to approximately 4.0 or be formed in this way, for example in a range of approximately 1.7 to approximately 3.9; for example in a range of approximately 2.3 to approximately 3.1.

In one configuration of the glassware, the first type of particles can have a mean diameter in a range of approximately 100 nm to approximately 50 µm, for example in a range of approximately 250 nm to approximately 350 nm. By way of example, particles of the first type that are formed as luminophore particles can have a mean diameter in a range of approximately 20 µm to approximately 30 µm. By contrast, particles of the first type that are formed as scattering centers for visible light can have a mean diameter in a range of approximately 230 nm to approximately 350 nm.

In one configuration of the glassware, the second type of particles can have a mean diameter in a range of approximately 10 nm to approximately 1 µm, for example in a range of approximately 10 nm to approximately 700 nm, for example in a range of approximately 10 nm to approximately 500 nm, for example in a range of approximately 10 nm to approximately 350 nm, for example in a range of approximately 10 nm to approximately 250 nm, for example in a range of approximately 10 nm to approximately 100 nm, for example in a range of approximately 10 nm to approximately 30 nm.

In one configuration of the glassware, the difference in absolute value of the refractive index of the first type of particles and/or the second type of particles with respect to the refractive index of the glass matrix with regard to at least one wavelength of an electromagnetic radiation can be greater than 0.05; for example in a range of approximately 0.05 to approximately 2.5.

In various configurations, the particles of the first type and/or of the second type can be amorphous or crystalline and/or nanoparticles.

In one configuration of the glassware, the ratio of the mean diameter of the particles of the second type to the mean diameter of the particles of the first type can be in a range of approximately $2 \cdot 10^{-4}$ to approximately 1. In other words: the second particles can have a smaller mean diameter than the particles of the first type. By way of example, the roughness of the surface can be reduced as a result.

In one configuration of the glassware, the second type of particles can be formed in such a way that the particles of the second type fill the cavity between the particles of the first type, for example in a type of sphere packing of the particles of the first type. By way of example, the density of particles in the glass matrix in the vicinity of the surface can be increased as a result. The roughness of the surface can be reduced as a result by virtue of the fact that the glass matrix fills less cavity volume between the particles, and can thus form a smoother surface.

In one configuration of the glassware, the ratio of the mean diameter of the second type of particles to the mean diameter of the first type of particles can be designed in such a way that the packing density of particles of the first type and/or second type in the glass matrix is in a range of 50% to 100%.

In one configuration of the glassware, the first type of particles and/or the second type of particles can in each case have one or more of the following optically functional properties with regard to the glass matrix and an electromagnetic radiation or be formed in this way: non-scattering high-index particles, scattering particles, radiation-absorbing, for example in the ultraviolet and/or infrared wavelength range of the electromagnetic radiation, for example as UV or IR protection; radiation-absorbing in the visible wavelength range of the electromagnetic radiation, for example as an optical filter; and/or wavelength-converting, for example as converter material. High-index particles can have for example a refractive index with regard to the electromagnetic radiation of greater than 1.7. The scattering particles can have for example with regard to the wavelength of the electromagnetic radiation and the refractive index of the glass matrix a refractive index and a diameter such that the scattering particles can scatter incident electromagnetic radiation.

In one configuration of the glassware, the second type of particles can have, with regard to the first type of particles, an identical material and/or an identical mean diameter. However, the second type of particles can differ from the first type of particles in at least one optically functional property, for example in the wavelength range of the optical functional property and/or the intensity of the optical functional property.

In one configuration of the glassware, the first type of particles and/or the second type of particles may include or be formed from a material such that it has an electrochromic, electrotropic, thermochromic and/or photochromic property in the glass matrix. By means of one or more of these properties of the particles of the first type and/or of the second type, the glassware can have a variation of the color, the opacity, the translucency, the transmission, the absorption, and/or the reflectivity for one or more wavelengths, wavelength ranges and/or polarizations of electromagnetic radiation incident on the glassware. However, the particles having the electrochromic, electrotropic, thermochromic and/or photochromic property should be formed in such a way that said particles, at the temperature at which they are distributed in the glass matrix, substantially maintain their form and/or are still present as particles in the glassware, that is to say are stable as particles in the glass matrix. By way of example, they can be enveloped.

As an example of an electrochromic and/or electrotropic property, the glassware can change from transparent to translucent, for example, in the event of a change in an external electric field or a current field through the glassware. An electrochromic property can be present for example in the case of particles of the first type and/or of the second type which include or are formed from, for example, a transition metal oxide, for example tungsten oxide ($WO_3$). For this purpose, the glassware as flat glass may include for example electrical contacts or electrodes on both planar sides, by means of which electrical contacts or electrodes the optical properties of the glassware can be set.

As an example of a thermochromic property, the glassware can be self-tinting, for example, in the event of a change in the temperature of the glassware, for example can change the reflectivity and/or transparency depending on the temperature. A thermochromic property can be present for example in the case of particles of the first type and/or of the second type which include or are formed from, for example, zinc oxide, indium(III) oxide, lead(II) oxide, nickel sulfate, titanium dioxide, for example as rutile; chromium(III) oxide:aluminum(III) oxide, and/or a mineral form, mixture or alloy having thermochromic properties of one of the materials of the particles as mentioned in the description.

In one configuration of the glassware, the difference in absolute value of the refractive index of the second type of particles with respect to the refractive index of the first type of particles with regard to at least one wavelength of an electromagnetic radiation can be greater than 0.05; for example in a range of approximately 0.05 to approximately 2.5; for example in a range of 0.05 to 1. By means of the different refractive indices, it is possible for example to form a gradient of the refractive index from the surface in the glassware.

In one configuration of the glassware, the glass matrix may include at least one further type of particles, wherein the further type of particles differs from the first type of particles and the second type of particles in at least one optically functional property, for example has a different refractive index, or is a luminophore.

In one configuration of the glassware, the glass matrix can have a second surface situated opposite the first surface at a distance, wherein particles of the first type are exposed at the second surface and the second surface is free of particles of the second type. As a result, for example, glassware can be formed whose first surface and second surface can have different optical properties, for example different reflectivities depending on the side of incidence on the glassware.

Alternatively, the second surface can be free of particles of the first type and of the second type. As a result, glassware can be formed whose surface is free of particles of the first type and second type. This can be advantageous, for example, if the material of the first type and of the second type is harmful to health, since it is thereby possible to avoid direct physical contact when handling the glassware.

Alternatively, the second surface can be free of particles of the first type and have particles of the second type exposed at the second surface. As a result, optically symmetrical glassware can be formed, such that a mix-up of the optical properties of the surfaces can be avoided.

In one configuration of the glassware, the glassware may include one or more plies of particles of the first type and/or of the second type. In the plies, the particles can be arranged for example in different volume concentrations in the glassware.

In one configuration of the glassware, the particles of the first type and/or of the second type can be distributed substantially homogeneously in the glassware. In this case, the substantially homogeneous distribution relates to the part of the glassware apart from the surface of the glassware.

In one configuration of the glassware, the particles of the first type and/or of the second type can be distributed in the glassware substantially at the surface. By way of example, glassware having a high mechanical fracture rate can be formed as a result.

In various embodiments, a method for producing glassware in accordance with one of the configurations mentioned above is provided, the method including: providing a molten glass matrix having a surface, distributing particles of a first type in the molten glass matrix through the first surface in such a way that the particles of the first type are completely surrounded by the molten glass matrix, such that the surface of the glass matrix is free of particles of the first type; distributing particles of a second type into the glass melt through the surface in such a way that the particles of the second type are arranged above and/or between the particles of the first type at least partly in the glass matrix at the surface of the glass matrix.

In various configurations of the method for producing glassware, the particles of the second type can have a higher refractive index than the particles of the first type.

In various configurations, the method for producing glassware can have features of the glassware; and glassware can have features of the method for producing the glassware, in such a way and insofar as the features are in each case expediently applicable.

In various configurations of the method for producing glassware, the particles of the first type can be formed and distributed in the molten glass matrix in such a way that the particles of the first type act as a diffusion barrier for the particles of the second type when the particles of the second type are distributed into the molten glass matrix.

In various configurations of the method for producing glassware, the particles of the second type can be distributed in the glass matrix in such a way that the refractive index of the glassware is increased, for example at the surface of the glassware.

In various configurations of the method for producing glassware, the method can furthermore include shaping the glass melt into a predefined shape, for example the shape of the glassware, for example as flat glass, hollow glass or glass fiber.

In various embodiments, an optoelectronic component including glassware in accordance with one of the configurations mentioned above is provided. The optoelectronic component may include an optically active region for converting an electric current into an electromagnetic radiation and/or converting an electromagnetic radiation into an electric current; wherein the glassware is formed as a covering body of the optically active region and is arranged in the beam path of the electromagnetic radiation. The covering body can be formed for example as a carrier and/or cover of the optoelectronic component.

In one configuration of the optoelectronic component, the particles of the first type and/or of the second type can form an extraction structure and/or a coupling-in structure with regard to the electromagnetic radiation. A coupling-in structure and/or an extraction structure can generally also be designated as a coupling structure.

In one configuration of the optoelectronic component, the optoelectronic component can furthermore include an encapsulation structure on or above the optically active region, wherein the encapsulation structure is formed in a hermetically impermeable fashion with respect to a diffusion of water and/or oxygen through the encapsulation structure into the optically active region, and wherein the encapsulation structure includes or is formed from the glassware. The covering body can be part of the encapsulation structure or form the latter. The encapsulation structure can be formed for example in order to prevent the diffusion of a gas, for example of a luminous gas, from the optically active region through the encapsulation structure.

In one configuration of the optoelectronic component, the optoelectronic component can be formed as a light emitting diode, a solar cell; a fluorescent tube, an incandescent lamp, a luminous tube or a halogen lamp.

In one configuration of the optoelectronic component, the optoelectronic component can be formed as an organic optoelectronic component, for example as an organic photodetector, an organic solar cell and/or an organic light emitting diode.

In one configuration of the optoelectronic component, the optically active region may include a first electrode, a second electrode and an organic functional layer structure between the first electrode and the second electrode, wherein the organic functional layer structure is formed for converting the electromagnetic radiation and/or the electric current, and wherein the first electrode is formed on or above the covering body and/or the covering body is arranged on or above the second electrode.

In various embodiments, a method for producing an optoelectronic component is provided, wherein the component includes glassware in accordance with one of the configurations mentioned above. The method may include: forming an optically active region on or above the glassware and/or applying the glassware on, above and/or around the optically active region. The glassware can be formed and arranged as an extraction structure and/or coupling-in structure with regard to the electromagnetic radiation absorbed or emitted by the optically active region in the beam path of the electromagnetic radiation.

In various configurations, the method for producing an optoelectronic component can have features of the optoelectronic component; and an optoelectronic component can have features of the method for producing an optoelectronic component in such a way and insofar as the features are in each case expediently applicable.

In various embodiments, a device for producing glassware in accordance with one of the configurations mentioned above is provided. The device including: a transport path for a molten glass matrix, wherein the transport path is designed such that the molten glass matrix is cooled along the transport path; a first coater designed for distributing a first type of particles in the molten glass matrix in a first cooling region, wherein the first coater is arranged along the transport path in such a way that the molten glass matrix has a viscosity with regard to the particles of the first type in the first cooling region, and that the particles of the first type are completely surrounded by the glass matrix, such that the surface of the glass matrix is free of particles of the first type; and at least one second coater designed for distributing a second type of particles in the molten glass matrix in a second cooling region, wherein the second coater is arranged along the transport path in such a way that the molten glass matrix has a viscosity with regard to the particles of the second type in the second cooling region, and that the particles of the second type are arranged above and/or between the particles of the first type at least partly in the glass matrix at the surface of the glass matrix.

In one configuration of the device, the first coater can be formed such that it is thermally stable with respect to the temperature of the glass matrix in the first cooling region, for example can be arranged at a distance above the glass matrix, and/or the second coater can be formed such that it is thermally stable with respect to the temperature of the glass matrix in the second cooling region, for example can be arranged at a distance above the glass matrix, for example in a thermally insulated fashion.

In one configuration of the device, the transport path may include an upper cooling region and a lower cooling region, wherein the first cooling region and the second cooling region are arranged between the upper cooling region and the lower cooling region, wherein the upper cooling region is designed for receiving the molten glass matrix, for example by means of a siphon-like passage, a lip-stone, a constriction and/or a conditioning tank; and the lower cooling region is designed for shaping the molten glassware, for example by means of a feeder, a spinning device, a centrifugal device, a roller.

In one configuration of the device, the transport path may include: a float bath or a feeder; and a cooling path.

In various embodiments, glassware including luminophore particles is provided. The glassware including: a glass matrix having a surface, luminophore particles in the glass matrix, wherein the luminophore particles include or are formed from a luminophore, wherein the luminophore absorbs an electromagnetic radiation having a first wavelength and emits part of the absorbed electromagnetic radiation with a second wavelength; wherein the luminophore particles are distributed in the glass matrix in such a way that the surface is substantially free of luminophore particles.

This makes it possible for example to prevent the luminophore from being exposed directly at the surface. This can be advantageous for example for luminophores that can be harmful to health.

In one configuration of the glassware including luminophore particles, the luminophore particles can be completely surrounded by the glass matrix.

In one configuration of the glassware including luminophore particles, the glass matrix can furthermore have a further surface situated opposite the surface, wherein the luminophore particles are arranged in the glass matrix in such a way that the luminophore particles are exposed at the further surface; or the luminophore particles are arranged in the glass matrix in such a way that the further surface is free of luminophore particles. By way of example, the luminophores can thereby be protected against external chemical or mechanical influences completely or on one side in the glassware.

In various configurations, the glassware including luminophore particles can have features in accordance with one of the configurations of the described features of the glassware including particles of the first type and second type, for example with regard to the glass matrix, surface, the properties of the particles, insofar as the features of the configurations are expediently applicable.

In various embodiments, a method for producing glassware including luminophore particles is provided, the method including: providing a molten glass matrix having a first surface and a second surface situated opposite the first surface at a distance, distributing luminophore particles in the molten glass matrix through the first surface, wherein the luminophore particles include or are formed from a luminophore, wherein the luminophore absorbs an electromagnetic radiation having a first wavelength and emits part of the absorbed electromagnetic radiation with a second wavelength; wherein the luminophore particles are distributed in the molten glass matrix in such a way that the first surface and/or the second surface are/is substantially free of luminophore particles.

In various configurations, the method for producing glassware including luminophore particles can have features of the glassware including luminophore particles; and glassware including luminophore particles can have features of the method for producing glassware including luminophore particles, in such a way and insofar as the features are in each case expediently applicable.

In various configurations, the method for producing glassware including luminophore particles can have features of the method for producing the glassware and of the glassware, and vice versa, insofar as they are in each case expediently applicable.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
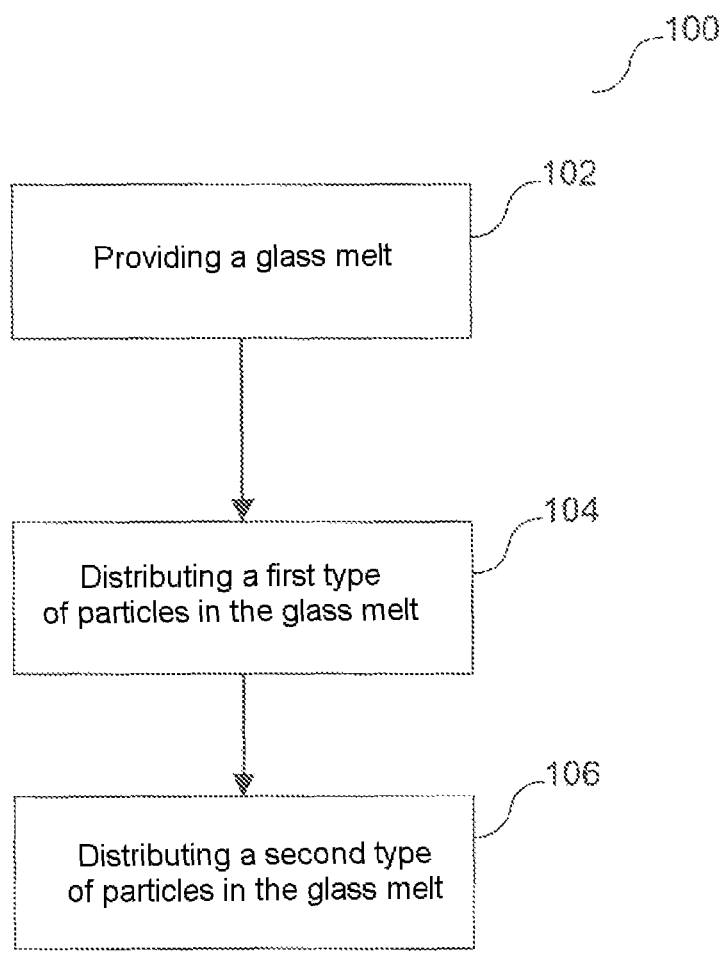
FIG. 1 shows a flow diagram for producing glassware in accordance with various embodiments.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, optoelectronic components are described, wherein an optoelectronic component includes an optically active region. The optically active region can emit electromagnetic radiation by means of a voltage applied to the optically active region. In various embodiments, the optoelectronic component can be formed in such a way that the electromagnetic radiation has a wavelength range including X-ray radiation, UV radiation (A-C), visible light and/or infrared radiation (A-C).

An optoelectronic component can be formed for example as a light emitting diode (LED), as an organic light emitting diode (OLED), as a light emitting transistor or as an organic light emitting transistor, for example an organic field effect transistor (OFET) and/or an organic electronic system.

Furthermore, a plurality of electromagnetic radiation-emitting components can be provided, for example in a manner accommodated in a common housing. An optoelectronic component may include an organic functional layer system, which is synonymously also designated as organic functional layer structure. The organic functional layer structure may include or be formed from an organic substance or an organic substance mixture which is designed for example for emitting an electromagnetic radiation from an electric current provided.

An organic light emitting diode can be formed as a so-called top emitter and/or a so-called bottom emitter. In the case of a bottom emitter, electromagnetic radiation is emitted from the electrically active region through the carrier. In the case of a top emitter, electromagnetic radiation is emitted from the top side of the electrically active region and not through the carrier.

A top emitter and/or a bottom emitter can also be formed as optically transparent or optically translucent; by way of example, each of the layers or structures described below can be or be formed as transparent or translucent with respect to the absorbed or emitted electromagnetic radiation.

In various embodiments, a coupling structure is a layer or structure designed for internally extracting or internally coupling in electromagnetic radiation. In the case of internal extraction, for example, electromagnetic radiation, for example light, can be extracted from an optoelectronic component, which can be guided or generated in the optically active region of the optoelectronic component. In various embodiments, a coupling structure can be formed by means of the particles of the first type, of the second type and/or luminophore particles in the glass matrix.

In various embodiments, the term "translucent" or "translucent layer" can be understood to mean that a layer is transmissive to electromagnetic radiation, for example to the light absorbed or generated by the optoelectronic component, for example in one or more wavelength ranges, for example to light in a wavelength range of visible light (for example at least in a partial range of the wavelength range of 380 nm to 780 nm). By way of example, in various embodiments, the term "translucent layer" should be understood to mean that substantially the entire quantity of light coupled into a structure (for example a layer) is also extracted from the structure (for example layer), wherein part of the light can be scattered in this case.

In various embodiments, the term "transparent" or "transparent layer" can be understood to mean that a layer is transmissive to electromagnetic radiation (for example at least in a partial range of the wavelength range of 380 nm to 780 nm), wherein light coupled into a structure (for example a layer) is also extracted from the structure (for example layer) without scattering or light conversion.

In various embodiments, a glass is a solid material without a crystal structure, such that the atoms or molecules of the glass do not form a lattice, but rather are arranged substantially randomly. In the glass, therefore, there is no long-range order among the atoms or molecules of the glass. Locally, however, the atoms or molecules of the glass may have a short-range order. A glass thus has an atomic or molecular microstructure referred to as amorphous. In various embodiments, the glass matrix of glassware is formed from or includes a glass or is formed as glass. Glassware can be referred to as a shaped glass body formed by means of shaping a softened glass or melting the raw materials of a glass. The process of melting glass can be understood to mean thermal liquefaction, i.e. melting, of a glass. In various embodiments, the glass can be a metallic glass or a nonmetallic glass. A nonmetallic glass can be for example a glass composed of an organic substance or an inorganic nonmetallic glass. An organic glass may include for example a thermoplastic, for example polyphthalamide (PPA), a thermosetting plastic, for example epoxies or polyurethane resin, an elastomer, for example a silicone, or a hybrid material including for example one of the materials mentioned; for example a polyacrylate, a polycarbonate, a polyolefin, a silicone, for example polydimethylsiloxane, polydimethylsiloxane/polydiphenylsiloxane; a silazane, an epoxy, or the like, for example a silicone hybrid, a silicone-epoxy hybrid. An inorganic nonmetallic glass can be for example a non-oxidic glass, for example a halide glass or chalcogenide glass; or an oxidic glass. An oxidic glass can be for example a phosphate glass, a silicate glass or a borate glass, for example an alkali metal borate glass. A silicate glass can be for example an alumosilicate glass, a lead silicate glass, an alkali metal silicate glass, an alkali metal-alkaline earth metal silicate glass or a borosilicate glass; for example a soda-lime silicate glass. In various embodiments, the glassware can be formed as a carrier or cover, for example as automotive glass in the automotive sector; as glass in mirrors, lenses, prisms in optical components, for example microscopes, telescopes, objectives, spectacle lenses, contact lenses; as tempered glass or laminated glass; as an optical waveguide, as carrier, a cover or an encapsulation in for example organic light emitting diodes, solar cells, fluorescent lamps; in glass fiber reinforced plastic, textile glass; window glass; laboratory glass; architectural or construction glass.

In various embodiments, the particles of the first type and/or of the second type may include or be a colorant. A colorant can be understood to be a chemical compound or a pigment that can color other substances or substance mixtures, i.e. alters the outer appearance of the glassware. Organic colorants for the particles of the first type and/or of the second type may include or be formed from a colorant of the following substance classes and derivatives of colorants: acridine, acridone, anthraquinone, anthracene, cyanine, dansyl, squaryllium, spiropyrans, boron-dipyrromethanes (BODIPY), perylenes, pyrenes, naphthalenes, flavins, pyrroles, porphyrins and the metal complexes thereof, diarylmethane, triarylmethane, nitro, nitroso, phthalocyanine and the metal complexes thereof, quinones, azo, indophenol, oxazines, oxazones, thiazines, thiazoles, xanthenes, fluorenes, flurones, pyronines, rhodamines, coumarins, metallocenes. Alternatively or additionally, the particles of the first type and/or of the second type may include or be formed from one of the following inorganic substances from the group of the inorganic colorant classes, inorganic colorant derivatives or inorganic colorant pigments: transition metals, rare earth oxides, sulfides, cyanides, iron oxides, zirconium silicates, bismuth vanadate, chromium oxides. Alternatively or additionally, the particles of the first type and/or of the second type may include or be formed from nanoparticles, for example carbon, for example carbon black; gold, silver, platinum.

In various embodiments, the particles of the first type and/or of the second type; and the luminophore particles may include or be formed from a luminophore. Luminophores are substances suitable for converting the wavelength of an electromagnetic radiation. In other words: a luminophore converts with losses electromagnetic radiation having one wavelength into electromagnetic radiation having a different wavelength, for example a longer wavelength (Stokes shift) or a shorter wavelength (anti-Stokes shift), for example by means of phosphorescence or fluorescence. The formation of electromagnetic radiation having a second wavelength from electromagnetic radiation having a first wavelength is called wavelength conversion. Wavelength conversion is used in various embodiments of optoelectronic components for the color conversion, for example for simplifying the generation of white light. In this case, for example, a blue light is converted into a yellow light. The color mixing of blue light and yellow light can form a white light. A luminophore can be arranged for example for the wavelength conversion of an electromagnetic radiation in the beam path of the electromagnetic radiation. For this purpose, the luminophore can be in physical contact with the radiation source, for example an optoelectronic component, i.e. share a common interface, or be designed as a remote phosphor. In various embodiments, the particles of the first type and/or of the second type; and the luminophore particles may include or be formed from one of the following substances: garnets, nitrides, silicates, oxides, phosphates, borates, oxynitrides, sulfides, selenides, aluminates, tungstates, and halides of aluminum, silicon, magnesium, calcium, barium, strontium, zinc, cadmium, manganese, indium, tungsten, and other transition metals or rare earth metals such as yttrium, gadolinium or lanthanum, which are doped with an activator, such as, for example, copper, silver, aluminum, manganese, zinc, tin, lead, cerium, terbium, titanium, antimony or europium. By way of example a luminophore can be an oxidic or (oxy)nitridic luminophore, such as a garnet, orthosilicate, nitrido(alumo)silicate, nitride or nitridoorthosilicate, or a halide or halophosphate. Concrete examples of suitable luminophores are strontium chloroapatite:Eu $((Sr,Ca)_5(PO_4)_3Cl:Eu;$ SCAP), yttrium aluminum garnet:cerium (YAG:Ce) or $CaAlSiN_3$:Eu. Furthermore, the luminophore or luminophore mixture can contain for example particles having light-scattering properties and/or auxiliaries. Examples of auxiliaries include surfactants and organic solvents.

Examples of light-scattering particles are gold, silver and metal oxide particles.

In various embodiments, the first type of particles can be formed as air inclusions or include air inclusions. In this case, the mean diameter can also be referred to as mean pore size.

In various embodiments, the particles of the first type and/or of the second type; and the luminophore particles may include or be formed from a substance which reduces the transmission of ultraviolet (UV) and/or infrared (IR) electromagnetic radiation. The lower UV and/or IR transmission can be realized for example by means of a higher absorption and/or reflection and/or scattering of UV and/or IR radiation. In various configurations, the particles of the first type and/or of the second type; and the luminophore particles may include or be formed from a substance, a substance mixture or a stoichiometric compound from the group of the following substances: $TiO_2$, $CeO_2$, $Bi_2O_3$, ZnO, $SnO_2$, a luminophore, UV- and/or IR-absorbing glass particles and/or suitable UV- and/or IR-absorbing metallic nanoparticles, wherein the luminophore, the glass particles and/or the nanoparticles have an absorption of electromagnetic radiation in the UV range and/or IR range. In various configurations, particles of the first type, of the second type and the luminophore particles may have no or only a low solubility in the molten glass matrix and/or not react, or react only poorly, therewith. By way of example, the material of the particles of the first type and/or of the second type, may include or be formed from a material having a melting point that is higher than the temperature of the glass matrix at which the particles are distributed in the glass matrix. In various configurations, the non-scattering high-index particles may lead to no or only to a slight scattering in the visible wavelength range of an electromagnetic radiation, for example nanoparticles having a grain size of less than approximately 50 nm, for example composed of $TiO_2$, $CeO_2$, ZnO or $Bi_2O_3$.

Figure 2:
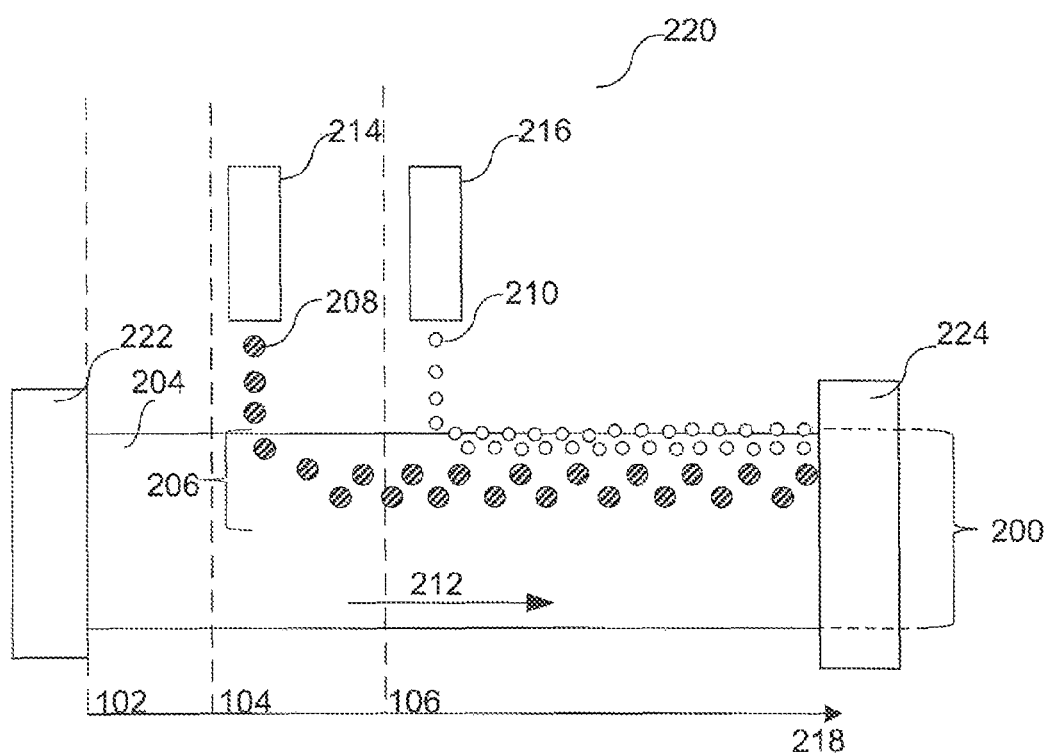
FIG. 2 shows a schematic illustration of a glass matrix in the method for producing the glassware in accordance with various embodiments.

In various embodiments, FIGS. 1 and 2 illustrate a method for producing glassware, a method for producing glassware including luminophore particles and a method for producing an optoelectronic component including glassware.

In various embodiments, a method 100 is provided which can be used to form glassware 200—illustrated in FIGS. 1 and 2. The glassware 200 can be formed such that it is for example at least translucent in the visible wavelength range of an electromagnetic radiation, for example transparent.

In various embodiments, the method 100 for producing glassware may include providing 102 a molten glass matrix 204 having a surface—for example illustrated ink FIGS. 1 and 2.

In various embodiments, providing 102 may include melting the raw substances of the glassware 200 to form a glass melt. Melting the raw substances of the glass melt can also be referred to as the initial founding phase with melting of the batch in the homogenization. This process can be carried out as a continuous process in a glass melting tank 222 in which glass melt is discharged from the glass melting tank 222 continuously or discretely and raw substance(s) is/are fed into the glass melting tank 222 continuously or discretely.

In various embodiments, the glass melt can be or form a molten glass matrix.

The temperature for melting the raw substances is dependent on the type of glass and raw substances. The raw substances of nonmetallic inorganic glasses can be melted and homogenized for example only at temperatures of more than 1200° C., for example at a temperature of approximately 1700° C. By contrast, the raw substances of nonmetallic organic glasses, for example depending on the chain length and the type of repeat units, can be melted and homogenized at a temperature as low as approximately 100° C. to 300° C.

In various embodiments, gas bubbles in the glassware 200 can constitute a glass defect that can adversely affect for example the mechanical durability of the glassware 200. Therefore, in various embodiments, providing 102 can furthermore include refining the glass melt, for example prior to cooling to the shaping temperature. In this case, refining can be understood to mean dispelling gas bubbles from the glass melt. The basic principle involves entraining small gas bubbles in the glass melt by more rapidly ascending larger gas bubbles. In a viscous glass melt, from economic standpoints, small bubbles cannot ascend rapidly enough in the glass melt, and so support measures may be necessary. A support measure may include for example adding at least one refining agent into the glass melt, for example in the form of chemical refining, for example sulfur refining with addition of sulfur or a sulfur-containing compound; or arsenic refining with addition of arsenic or an arsenic-containing compound, for example during the production of nonmetallic, inorganic glasses. Additionally or alternatively, the glass melt can be refined mechanically or physically, for example by means of so-called bubbling. In this case, by blowing gases into the glass melt, the proportion of bubbles in the glass melt is reduced by virtue of the fact that the small bubbles in the glass melt combine with the larger gas bubbles blown in and can ascend more easily. Alternatively or additionally, the refining can be carried out by means of action of ultrasound and/or a reduced pressure on the glass melt.

Alternatively, in various embodiments, refining can be dispensed with, or gas bubbles can be introduced into the glass melt in a targeted manner. The gas bubbles in the glass melt can be for example scattering centers for electromagnetic radiation. In this case, distributing gas bubbles as first particles is not part of providing 102, but rather part of distributing 104 (air/gas) particles in the molten glass matrix.

Furthermore, providing 102 may include cooling the glass melt from the melting point of the raw substances to a temperature above the shaping temperature of the glass melt.

Cooling the glass melt can be carried out for example in a working tank, conditioning tank and/or on a transport path 218. These/this can be a structurally separate region of a continuously operating glass melting tank 222. In this region the molten glass is cooled sufficiently in a controlled manner prior to shaping, i.e. brought to the shaping temperature. For this purpose, the molten glass matrix 204 can be transported for example along a transport path 218 (illustrated by means of the arrow 212 in FIG. 2).

For each glass it is possible to define a cooling region that is delimited by the so-called upper cooling temperature and the lower cooling temperature.

The upper cooling temperature can be for example at the beginning of the transport path 218, and the lower cooling region at the end of the transport path 218. At the beginning of the transport path 218, the melting tank 222, working tank and/or conditioning tank can be adjacent and the glass melt 204 can be provided 102—for example illustrated in FIG. 2. During the production of hollow glass, the working tank can be separated relative to the melting tank 222 for example by means of a siphon-like passage. During the production of flat glass, for example float glass, the working tank can be separated relative to the melting tank 222 for example by means of a constriction. At the end of the transport path 218, the glass melt 204 having particles 208, 210 can be provided—for example illustrated in FIG. 2, and the removal point 224 and/or the shaping can follow.

The beginning and the end of the transport path 218 can be defined for example by means of the viscosity of the glass melt. By way of example, in the case of a soda-lime silicate glass, the upper cooling temperature can be that temperature at which the glass has a viscosity of $10^{15}$ mPa·s. At the lower cooling temperature, for example, a viscosity of $10^{16.5}$ mPa·s can be present, that is to say for example between 590° C. and 450° C. in the case of soda-lime silicate glass.

Thermomechanical stresses in the glassware 200 can be reduced by tempering the glass melt, that is to say by defined slow cooling in the cooling region.

With the viscosities prevailing in the cooling region, a stress relaxation may just still be possible, such that permanent stresses in the glass body can be avoided if this is necessary for the respective application. However, thermal strains may also be necessary in an application-specific manner, for example in the case of toughened safety glass.

Furthermore, the method 100 may include distributing 104 particles 208 of a first type in the molten glass matrix 204 through the surface of the glass melt in such a way that the particles 208 of the first type are completely surrounded by the molten glass matrix 204, such that the surface of the glass matrix 204 is free of particles 208 of the first type—for example illustrated in FIGS. 1 and 2. Distributing the particles 208 of the first type can be carried out for example between the start of the transport path 218 and the end of the transport path 218—for example illustrated in FIGS. 1 and 2.

The first type of particles 208 can have for example a refractive index in a range of approximately 1.5 to approximately 4.0, for example in a range of approximately 1.7 to approximately 3.9; for example in a range of approximately 2.3 to approximately 3.1. The difference in the absolute value of the refractive index of the first type of particles 208 with respect to the refractive index of the glass matrix 204 with regard to at least one wavelength of an electromagnetic radiation can be greater than 0.05. In other words: the particles 208 of the first type can be scattering with regard to the glass matrix 204 for the electromagnetic radiation which is incident on the particles 208 of the first type in the glass matrix 204. Such particles can for example also be referred to as high-index particles. The first type of particles 208 can have a mean diameter in the range of approximately 100 nm to approximately 50 µm, for example in a range of approximately 250 nm to approximately 350 nm. In other words: the particles 208 of the first type can be formed such that they are scattering or non-scattering with regard to visible light. The first type of particles 208 can have one or more of the following optically functional properties with regard to the glass matrix 204 and an electromagnetic radiation or be formed in this way: as non-scattering high-index particles, as scattering particles, radiation-absorbing, for example in the ultraviolet and/or infrared wavelength range of the electromagnetic radiation, radiation-absorbing in the visible wavelength range of the electromagnetic radiation, and/or wavelength-converting.

Furthermore, the method 100 may include distributing 106 particles 210 of a second type into the glass melt 204 through the surface of the glass melt in such a way that the particles 210 of the second type are arranged above and/or between the particles 208 of the first type at least partly in the glass matrix 204 at the surface of the glass matrix 204—for example illustrated in FIGS. 1 and 2. Distributing the particles 210 of the second type can be carried out for example between the start of the transport path 218 and the end of the transport path 218, for example at the same time as or after the distribution of the first type of particles 208 in the glass melt 204—for example illustrated in FIGS. 1 and 2.

In one embodiment, the second type of particles 210 can have a refractive index in a range of approximately 1.5 to approximately 4.0, for example in a range of approximately 1.7 to approximately 3.9; for example in a range of approximately 2.3 to approximately 3.1. The difference in the absolute value of the refractive index of the second type of particles 210 with respect to the refractive index of the glass matrix 204 with regard to at least one wavelength of an electromagnetic radiation can be for example greater than 0.05. In other words: the particles 210 of the second type can be formed such that they are scattering with regard to the glass matrix 204 for the electromagnetic radiation that is incident on the particles 210 of the second type in the glass matrix 204. In one embodiment, the second type of particles 210 can have a mean diameter in a range of approximately 10 nm to approximately 1 µm, for example in a range of approximately 10 nm to approximately 30 nm. In other words: the particles 210 of the second type can be formed such that they are scattering or non-scattering with regard to visible light. The second type of particles 210 can have one or more of the following optically functional properties with regard to the glass matrix 204 and an electromagnetic radiation or be formed in this way: non-scattering high-index particles, scattering particles, radiation-absorbing, for example in the ultraviolet and/or infrared wavelength range of the electromagnetic radiation, radiation-absorbing in the visible wavelength range of the electromagnetic radiation, and/or wavelength-converting.

In one embodiment, the ratio of the mean diameter of the second type of particles 210 to the mean diameter of the first type of particles 208 can be in a range of $2 \cdot 10^{-4}$ to 1. The particles 210 of the second type can be formed in such a way that the particles 210 of the second type can fill the cavity between the particles 208 of the first type, for example in the case of a type of sphere packing of the particles 208 of the first type. In other words: the particles 210 of the second type can fill a part of the space between the particles 208 of the first type instead of the glass matrix 204. In one embodiment, the ratio of the mean diameter of the particles 210 of the second type to the mean diameter of the particles 208 of the first type can be designed in such a way that the packing density of particles 208, 210 of the first type and second type in the glass matrix 204 is in a range of 50% to 100%.

In one embodiment, the second type of particles 210 can differ from the first type of particles 208 in at least one optically functional property, for example in the mean diameter of the particles, the wavelength range of the optical functional property and/or the intensity of the optical functional property.

In one embodiment, the first type of particles 208 and the second type of particles 210 can be formed in such a way that the difference in the absolute value of the refractive index of the second type of particles 210 with respect to the refractive index of the first type of particles 208 with regard to at least one wavelength of an electromagnetic radiation is greater than 0.05; for example in a range of 0.05 to 1. In other words: the particles 210 of the second type can have a higher refractive index than the particles 208 of the first type.

In one embodiment, in the method 100, at least one further type of particles can be distributed in the molten glass matrix 204, wherein the further type of particles differs from the first type of particles and the second type of particles in at least one optically functional property.

In various embodiments, only one type of particles, the first type of particles 208 and/or the second type of particles 210, can be distributed in the glass matrix 204, wherein the only one type of particles is formed as luminophore particles or they include a luminophore. The luminophore particles can have a range of approximately 1.5 to approximately 4.0, for example in a range of approximately 1.7 to approximately 3.9; for example in a range of approximately 2.3 to approximately 3.1. The luminophore particles can have a mean diameter in a range of approximately 100 nm to approximately 50 μm, for example in a range of approximately 20 μm to approximately 30 μm. The difference in the absolute value of the refractive index of the luminophore particles with respect to the refractive index of the glass matrix 204 with regard to at least one wavelength of an electromagnetic radiation can be greater than 0.05. The luminophore particles can additionally or alternatively have one or more of the following optically functional properties with regard to the glass matrix 204 and an electromagnetic radiation or be formed in this way: non-scattering high-index particles, scattering particles, radiation-absorbing, for example in the ultraviolet and/or infrared wavelength range of the electromagnetic radiation, and/or radiation-absorbing in the visible wavelength range of the electromagnetic radiation.

In various embodiments, the method for producing glassware 200 including luminophore particles, includes providing 102 a molten glass matrix 204 having a first surface and a second surface situated opposite the first surface at a distance; distributing luminophore particles in the molten glass matrix 204 through the first surface, wherein the luminophore particles include or are formed from a luminophore, wherein the luminophore absorbs an electromagnetic radiation having a first wavelength and emits part of the absorbed electromagnetic radiation with a second wavelength; and wherein the luminophore particles are distributed in the molten glass matrix 204 in such a way that the first surface and/or the second surface are/is substantially free of luminophore particles.

In one embodiment, the luminophore particles can be distributed in the glass matrix 204 in such a way that the luminophore particles are completely surrounded by the molten glass matrix 204, such that the first surface and/or the second surface of the glass matrix 204 are/is free of luminophore particles. Alternatively, the luminophore particles can be distributed in the glass matrix 204 in such a way that the luminophore particles are at least partly in the glass matrix 204 at the first surface of the glass matrix.

In one embodiment, the molten glass matrix 204 can be provided on a transport path 218, wherein the molten glass matrix 204 is cooled on the transport path 218, wherein the luminophore particles are distributed in the glass matrix 204 on the transport path 218.

In various embodiments, the particles 208 of the first type 208 are distributed in the glass melt 204 in a first cooling region and the particles 210 of the second type are distributed in the glass melt 204 in a second cooling region, that is to say for example at different regions along the transport path 218, wherein the molten glass matrix 204 can have different viscosities in the different regions. The position of the first cooling region and of the second cooling region along the transport path 218, that is to say distributing 104, 106 the particles 208, 210 may be dependent on the (visco) elastic properties of the molten glass matrix 204 and the properties of the particles 208, 210. Properties of the particles 208, 210, which can influence the cooling region, that is to say the region along the transport path at which the particles 208, 210 are distributed in the glass matrix 204, may be for example the shape, the size, the size distribution, the density and/or the melting point of the particles.

In one embodiment, the particles 208 of the first type and the particles 210 of the second type can be distributed in the glass matrix 204 in such a way that the glassware 200 includes one or more plies of particles 208 of the first type and/or particles 210 of the second type. Alternatively, the particles 208 of the first type and the particles 210 of the second type can be distributed in the glass matrix 204 in such a way that the particles 208 of the first type and/or the particles 210 of the second type are distributed substantially homogeneously in the glassware 200. Alternatively, the particles 208 of the first type and the particles 210 of the second type can be distributed in the glass matrix 204 in such a way that the particles 208 of the first type and/or the particles 210 of the second type are distributed in the glassware 200 substantially at the surface.

In one embodiment, the first type of particles 208 can be formed and be distributed in the molten glass matrix 204 in such a way that the particles 208 of the first type act as a diffusion barrier for the particles 210 of the second type during distribution into the molten glass matrix 204.

In one embodiment, the particles 208, 210 can be distributed in the glass matrix 204 in such a way that the refractive index of the glassware 200 is increased, for example at the surface of the glassware 200.

In one embodiment, the glass matrix 204 can have a second surface situated opposite the first surface at a distance, wherein the particles 208 of the first type and the particles 210 of the second type are distributed through the first surface in the glass matrix 204. The particles 208, 210 can be distributed in the glass matrix 204 with regard to the viscosity of the glass matrix in the first cooling region and the second cooling region in such a way that particles 208 of the first type are exposed at the second surface and the second surface is free of particles of the second type. Alternatively, the particles 208 of the first type and the particles 210 of the second type can be distributed in the glass matrix 204 in such a way that the second surface is free of particles 208 of the first type and particles 210 of the second type. Alternatively, the particles 208 of the first type and the particles 210 of the second type can be distributed in the glass matrix 204 in such a way that the second surface is free of particles 208 of the first type and particles 210 of the second type are exposed at the second surface.

In various embodiments, distributing the particles 208, 210 in the molten glass matrix 204 can be carried out between/with the introduction of the raw substances in the glass melting tank 222 or the storage tank, for example by virtue of the particles 208, 210 having a higher melting point than the raw substances of the glass melt 204; and the shaping of the glass melt 204.

In one embodiment, the luminophore particles can be distributed in such a way that the glassware 200 includes one or more plies of luminophore particles. Alternatively or additionally, the luminophore particles can be distributed substantially homogeneously in the glassware 200. Alternatively, the luminophore particles can be distributed in the glassware 200 substantially at the surface.

The glass melt, i.e. the molten glass matrix, has a surface through which—as has been described above—particles 208, 210 can be distributed in the glass matrix 204 in the course of the method 100. In one embodiment, the first type of particles 208 and/or the second type of particles 210 can be formed and distributed in the glass matrix 204 in such a way that the surface of the glassware 200 or of the glass matrix 204, after the process of distributing 106 the second type of particles 210, is formed with a root mean square (RMS) roughness that is less than approximately 10 nm, that is to say substantially smoothly for applying subsequent thin layers. Additionally or alternatively, the glassware 200 can be formed in such a way that the surface has in an exposed fashion a portion of the particles 210 of the second type and glass matrix 204.

In various embodiments, a method for producing an optoelectronic component is provided, wherein the component includes glassware 200 described above and the method includes providing such glassware. The method may include forming an optically active region on or above the glassware 200 and/or applying the glassware 200 on, above and/or around the optically active region or forming the optically active region on the glassware 200.

Figure 3:
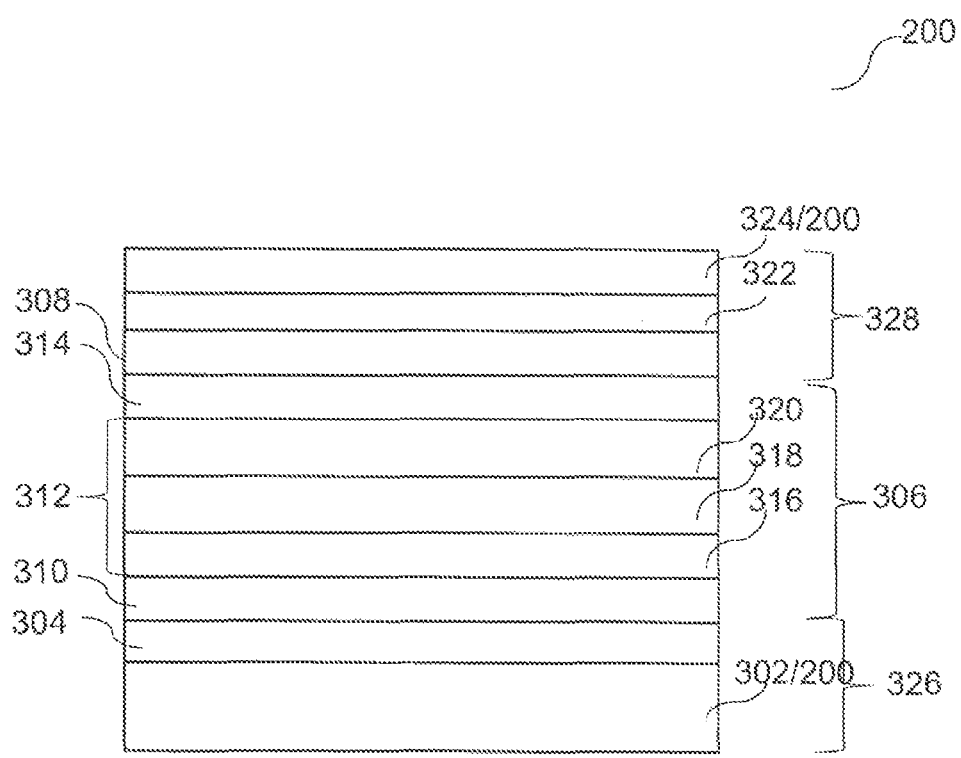
FIG. 3 shows an optoelectronic component including the glassware in accordance with various embodiments.

In one embodiment, glassware 200 can be designed as a carrier or a cover of the optoelectronic component, for example of an organic light emitting diode (OLED)—for example illustrated in FIG. 3.

The glassware 200 including second particles, which can increase the refractive index of the glassware 200 and which are formed for example as high-index particles, can be designed for example as an extraction structure 206 and/or coupling-in structure 206 for the electromagnetic radiation emitted by the OLED. In order to enable an optimum extraction from the OLED, the high-index particles should project from the surface of the glass of the glassware 200 or end at the surface of the glass. In other words: the high-index particles should be a part of the surface of the glassware 200 with regard to the incidence side for the electromagnetic radiation, and, for example, the glass matrix 204 should substantially not be formed over them. The high-index particles or agglomerates thereof should, moreover, be large enough to refract the electromagnetic radiation to be extracted. Furthermore, high-index particles or agglomerates thereof may be necessary which have a dimensioning in the direction of propagation of the electromagnetic radiation of the order of magnitude of the optical wavelength of the electromagnetic radiation.

As a result, for example, it is possible to achieve a significant improvement in the surface quality of a scattering film produced by means of a float glass method in accordance with one of the configurations of the method. For example by particles of different sizes being applied to or introduced into the glass ribbon at different depth regions relative to the surface of the glass ribbon and thus at different temperature regions along the glass ribbon.

In one embodiment, firstly, particles 208 of a first type, for example large scattering particles or agglomerates of particles of the order of magnitude of the optical wavelength of the electromagnetic radiation to be scattered, are introduced into the glass ribbon or the glass melt 204—for example illustrated in FIG. 2. The first temperature region or cooling region, in which the particles 208 are introduced into the glass melt 204, should be set on the basis of the temperature-dependent viscosity of the glass melt 204 and the buoyancy of the particles 208 in the glass melt 204 in such a way that said particles/agglomerates sink to below the surface of the glass melt 204 or glass matrix 204. In other words: the particles of the first type can be completely surrounded by the glass matrix 204 and the surface can be free of particles of the first type.

In a different, second temperature region of the glass melt 204, for example at a different location along a float glass ribbon, particles 210 of a second type can be applied, introduced and/or distributed into the glass ribbon. The second temperature region, in which the particles 210 of the second type are applied, introduced and/or distributed into the glass melt 204, should be set on the basis of the temperature-dependent viscosity of the glass melt 204 and the buoyancy of the particles in the glass melt 204 in such a way that said particles/agglomerates are exposed at least partly at the surface of the glass melt 204 or glass matrix 204.

The second type of particles 210 can be significantly smaller than the first type of particles 208. By means of the second type of particles 210, for example, the effective refractive index, that is to say the refractive index averaged in a plane over the refractive index of the particles 210 and the glass matrix 204, at the interface of the glassware 200 can be increased without producing a high roughness, for example with respect to an interface at which only particles of the first type 208 are exposed.

For applying, distributing and/or introducing the (types of) particles 208, 210 into the glass melt 204, provision can be made of a plurality of coaters 214, 216 having different types of particles 208, 210, for example particle sizes, particles of different materials, which introduce and/or distribute the particles onto and/or into the glass melt 204 in different temperature regions—as will be described in even greater detail below. By way of example, in a float glass method, at different locations along the glass ribbon. This can lead to the improvement of the surface quality of the substrate glass with an internal extraction effect. In other words: in various embodiments, for the first type of particles 208 and for the second type of particles 210 it is possible to use, for example, the same or different materials, having identical or different optical properties and/or having different mean sizes. These can be applied to a glass ribbon in different temperature regions of the glass melt 204, that is to say for example at different positions along a glass ribbon in a float glass method, and can sink into said glass ribbon or descend therein.

The particles 208 of the first type, which for example can have a larger mean dimensioning than the particles 210 of the second type, can be for example a basis for the light scattering in the glassware 200. The particles 210 of the second type from the second coater 216 can subsequently be applied to or introduced into the glass ribbon in order to increase the effective refractive index for example at the glassware-air interface or glassware-OLED interface.

In various embodiments, more than two coaters can be provided, and for example more than two types of particles having different mean particle sizes can be distributed or arranged into the glass ribbon.

In various embodiments, the first type of particles 208 and the second type of particles 210 can be formed as scattering, refracting, reflecting and/or absorbing with regard to an electromagnetic radiation that can be emitted or absorbed in the optoelectronic component.

In various embodiments, the first type of particles 208 and the second type of particles 210 may include or be formed from high refractive index materials. The particles 208, 210 can be formed in such a way that they withstand substantially dimensionally stably the temperature in the molten glass matrix 204, for example in the first cooling region or second cooling region, for example in the float glass ribbon. By way of example, the particles 208, 210 can be or include titanium dioxide, zinc oxide, indium zinc oxide (IZO), aluminum zinc oxide (AZO), aluminum oxide, indium tin oxide (ITO) and tin oxide.

In various embodiments, the first type of particles 208 and the second type of particles 210 can have a filter effect with regard to an electromagnetic radiation that can be emitted or absorbed in the optoelectronic component. In other words: the first type of particles 208 and/or the second type of particles 210 can be formed or act as colorants.

In various embodiments, the first type of particles 208 and the second type of particles 210 can have a color conversion with regard to an electromagnetic radiation that can be emitted or absorbed in the optoelectronic component. In other words: the first type of particles 208 and/or the second type of particles 210 can be formed or act as luminophores, for example phosphors.

During the production of hollow glass, the removal point 224 can be a feeder. In this case, drops are produced from the cooled glass melt 204 and are guided via a chute system into glass machinery situated underneath. During flat glass production, for example according to the float glass method, the cooled glass melt 204 can pass for example via a lip-stone into the float bath, wherein the float bath can be part of the transport path 218.

The molten glass matrix including particles 208, 210 or luminophore particles, can be brought to a predefined shape and thus form the glassware 200. The glassware 200 can be formed as a flat glass, for example as a carrier, a cover, a window, a pane or a planar optical waveguide. Alternatively, the glassware 200 can be formed as a hollow glass, for example as a glass tube or glass bulb. Alternatively, the glassware 200 can be formed as a glass fiber, for example as glass wool or an optical waveguide. In various embodiments, a flat glass can be a float glass or rolled glass. Alternatively, the flat glass can be pulled or cast. Float glass is a flat glass produced by means of a float method. In other words: in various embodiments, the glassware 200 can be formed as an amorphous layer, an amorphous ribbon or an amorphous shaped body, for example can be formed in one of the following forms: hollow glass, flat glass, tubular glass, glass fiber. Depending on the type of glassware 200 to be produced and the type of glass, the shaping can vary. By way of example, hollow-glass glassware can be formed in a plurality of methods by pressing, blowing, sucking and combinations of these techniques, for example in a blowing-blowing method or pressing-blowing method. By way of example, glass fibers, for example for glass wool or as an optical waveguide, can be formed by means of spinning in a rod pulling method, nozzle pulling method, centrifugal method (TEL method) or nozzle blowing method (TOR method). By way of example, flat glass can be formed by means of a float glass method, a rolling method or a pulling method. By way of example, tubular glass can be formed by means of a continuous pulling method or a centrifugal method.

In various embodiments, a device 220 for producing glassware 200 in accordance with one of the embodiments described above is provided—for example illustrated schematically in FIG. 2.

The device 220 may include a transport path 218 for a molten glass matrix 204. The transport path 218 is designed such that the molten glass matrix 204 is transported (indicated by means of the arrow 212), along the transport path 218 from a melting tank 222 to a removal point 224 and in the process is cooled from the melting point in an upper cooling region of the transport path 218 to the shaping temperature in a lower cooling region of the transport path 218.

The transport path 218 may include for example a storage tank, a float bath, a cooling path, a feeder, a float path, a conveyor belt, a conveying line and/or a conveying chute.

The device 220 furthermore includes a first coater 214, which is designed for distributing a first type of particles 208 in the molten glass matrix 204 in a first cooling region.

In various embodiments, the first coater may include a type of grinding mechanism, a jolting, shaking or vibrating device and/or an atomizer. The first coater 214 can be formed in such a way that the particles 208 of the first type are distributed by means of the gravitational force and/or a carrier gas on or above the surface of the molten glass matrix. Alternatively or additionally, the particles of the first type can be applied to the surface of the molten glass matrix 204 by means of an electric field; for example in an electric field for the case where the particles are electrically charged or polarizable; for example by means of cathode sputtering.

The first coater 214 is arranged along the transport path in such a way that the molten glass matrix 204 has a viscosity with regard to the particles 208 of the first type in the first cooling region, such that the particles 208 of the first type are completely surrounded by the glass matrix 204, such that the surface of the glass matrix 204 is free of particles of the first type 208.

The device 220 can furthermore include at least one second coater 216 designed for distributing a second type of particles 210 in the molten glass matrix 204 in a second cooling region.

The second coater 216 can be formed in accordance with one of the configurations of the first coater 214.

The second coater 216 can be arranged along the transport path 218 in such a way that the molten glass matrix 204 has a viscosity with regard to the particles 210 of the second type in the second cooling region, such that the particles 210 of the second type are arranged above and/or between the particles 208 of the first type at least partly in the glass matrix 204 at the surface of the glass matrix 204.

In one embodiment, the first coater 214 can be formed such that it is thermally stable with regard to the temperature of the glass matrix 204 in the first cooling region, for example can be arranged at a distance above the glass matrix 204, and/or the second coater 216 can be formed such that it is thermally stable with regard to the temperature of the glass matrix 204 in the second cooling region, for example can be arranged at a distance above the glass matrix 204.

The first cooling region and the second cooling region can be arranged between the upper cooling region and the lower cooling region.

In various embodiments, glassware, glassware including luminophore particles and an optoelectronic component including glassware are illustrated in FIG. 3.

In various embodiments, glassware 200 includes a glass matrix 204 having a surface, a first type of particles 208, and at least one second type of particles 210. The particles 210 of the second type can have for example a higher refractive index than the particles 208 of the first type. The particles 208 of the first type can be completely surrounded by the glass matrix 204, such that the surface of the glass matrix 204 is free of particles of the first type 208, and the particles of the second type are arranged above and/or between the particles of the first type at least partly in the glass matrix 204 or at the surface of the glass matrix 204 in order to increase the refractive index of the glassware 200. The surface can thus have for example a root mean square roughness that is less than approximately 10 nm. The surface can have in an exposed fashion a portion of the particles of the second type and the glass matrix 204.

In various embodiments, the glassware can have features of the above-described method for producing the glassware or can be formed in this way in such a way and insofar as the features are in each case expediently applicable.

In various embodiments, the glassware 200 can be formed with luminophore particles. In this case, the glassware includes a glass matrix 204 having a surface. Luminophore particles are distributed in the glass matrix 204, wherein the luminophore particles include or are formed from a luminophore. The luminophore can absorb an electromagnetic radiation having a first wavelength and emit part of the absorbed electromagnetic radiation with a second wavelength. The luminophore particles can be distributed in the glass matrix 204 in such a way that the surface is substantially free of luminophore particles.

The luminophore particles may include for example particles in accordance with one of the described configurations of the particles of the first type and/or of the second type in such a way and insofar as the features are in each case expediently applicable.

In various embodiments, the luminophore particles can be completely surrounded by the glass matrix 204. The glass matrix 204 can furthermore have a further surface situated opposite the surface, wherein the luminophore particles are arranged in the glass matrix 204 in such a way that the luminophore particles are exposed at the further surface. Alternatively, the luminophore particles can be arranged in the glass matrix in such a way that the further surface is free of luminophore particles.

In various embodiments, an optoelectronic component including glassware 200 in accordance with one of the configurations described above is provided. The optoelectronic component includes an optically active region 306 for converting an electric current into an electromagnetic radiation and/or for converting an electromagnetic radiation into an electric current. The glassware 200 can be formed as a covering body 324/200 of the optically active region 306 and be arranged in the beam path of the electromagnetic radiation. A covering body 324/200 can surround and thus cover the optically active region 306 for example in the form or as part of an encapsulation structure 328. Alternatively or additionally, the optically active region 306 can be formed on the covering body 302/200, as a result of which the underside of the optically active region 306 is thus covered by the covering body 302/200.

The particles 208 of the first type and/or the particles 210 of the second type can form an extraction structure 206 and/or a coupling-in structure 206 with regard to the electromagnetic radiation.

In various embodiments, the optoelectronic component 300 can furthermore include an encapsulation structure 328 on or above the optically active region 306, wherein the encapsulation structure 328 is formed in a hermetically impermeable fashion with respect to a diffusion of water and/or oxygen through the encapsulation structure 328 into or out of the optically active region 306, and wherein the encapsulation structure 328 includes the glassware 200 or can be formed therefrom.

In various embodiments, the optoelectronic component can be formed as a light emitting diode, a solar cell; a fluorescent tube, an incandescent lamp, a luminous tube or a halogen lamp.

The optoelectronic component can be formed for example as an organic optoelectronic component 300, for example as an organic photodetector, an organic solar cell and/or an organic light emitting diode—for example illustrated in FIG. 3.

In the case of an organic optoelectronic component, the optically active region 306 may include a first electrode 310, a second electrode 314 and an organic functional layer structure 312 between the first electrode 310 and the second electrode 314, wherein the organic functional layer structure 312 is formed for converting the electromagnetic radiation and/or the electric current.

In various embodiments, an optoelectronic component 300 described below may include glassware 200 described above, wherein the glassware 200 can be formed for example as a carrier 302/202 and/or a cover 324/202 with an integrated coupling structure 206. The particles 210 of the second type can have for example a physical contact with the optically active region 306, wherein electromagnetic radiation is coupled into the coupling structure 206 from the optically active region, and vice versa.

In various embodiments, an organic optoelectronic component 300 may include a hermetically impermeable substrate 326, an active region 306 and an encapsulation structure 328.

The hermetically impermeable substrate 326 may include a carrier 302 and a first barrier layer 304. Alternatively or additionally, the hermetically impermeable substrate 326 may include or be the glassware 200.

The active region 306 is an electrically active region 306 and/or an optically active region 306. The active region 306 is for example that region of the optoelectronic component 300 in which electric current for the operation of the optoelectronic component 300 flows and/or in which electromagnetic radiation is generated and/or absorbed.

The organic functional layer structure 312 may include one, two or more functional layer structure units and one, two or more intermediate layer structure(s) between the layer structure units. The organic functional layer structure 312 may include for example a first organic functional layer structure unit 316, an intermediate layer structure 318 and a second organic functional layer structure unit 320.

The encapsulation structure 326 may include a second barrier layer 308, a close connection layer 322 and a cover 324. Alternatively or additionally, the encapsulation structure 326 may include or be the glassware 200.

The carrier 302 may include or be formed from glass, quartz and/or a semiconductor material. Furthermore, the carrier may include or be formed from a plastics film or a laminate including one or including a plurality of plastics films. The plastic may include or be formed from one or a plurality of polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN).

The carrier 302 may include or be formed from a metal, for example copper, silver, gold, platinum, iron, for example a metal compound, for example steel.

The carrier 302 can be embodied as opaque, translucent or even transparent.

The carrier 302 can be a part of a mirror structure or form the latter.

The carrier 302 can have a mechanically rigid region and/or a mechanically flexible region or be formed in this way, for example as a film.

The carrier 302 can be formed as a waveguide for the electromagnetic radiation, for example can be transparent or translucent with respect to the emitted or absorbed electromagnetic radiation of the optoelectronic component 300.

The first barrier layer 304 may include or be formed from one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof.

The first barrier layer 304 can be formed by means of one of the following methods: an atomic layer deposition (ALD) method, for example a plasma enhanced atomic layer deposition (PEALD) method or a plasmaless atomic layer deposition (PLALD) method; a chemical vapor deposition (CVD) method, for example a plasma enhanced chemical vapor deposition (PECVD) method or a plasmaless chemical vapor deposition (PLCVD) method; or alternatively by means of other suitable deposition methods.

In the case of a first barrier layer 304 including a plurality of partial layers, all the partial layers can be formed by means of an atomic layer deposition method. A layer sequence including only ALD layers can also be designated as a "nanolaminate".

In the case of a first barrier layer 304 including a plurality of partial layers, one or a plurality of partial layers of the first barrier layer 304 can be deposited by means of a different deposition method than an atomic layer deposition method, for example by means of a vapor deposition method.

The first barrier layer 304 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

The first barrier layer 304 may include one or a plurality of high refractive index materials, for example one or a plurality of material(s) having a high refractive index, for example having a refractive index of at least 2.

Furthermore, it should be pointed out that, in various embodiments, a first barrier layer 304 can also be entirely dispensed with, for example for the case where the carrier 302 is formed in a hermetically impermeable fashion, for example includes or is formed from glass, metal, metal oxide.

The first electrode 304 can be formed as an anode or as a cathode.

The first electrode 310 may include or be formed from one of the following electrically conductive materials: a metal; a transparent conductive oxide (TCO); a network composed of metallic nanowires and nanoparticles, for example composed of Ag, which are combined with conductive polymers, for example; a network composed of carbon nanotubes which are combined with conductive polymers, for example; graphene particles and graphene layers; a network composed of semiconducting nanowires; an electrically conductive polymer; a transition metal oxide; and/or the composites thereof. The first electrode 310 composed of a metal or including a metal may include or be formed from one of the following materials: Ag, Pt, Au, Mg, Al, Ba, In, Ca, Sm or Li, and compounds, combinations or alloys of these materials. The first electrode 310 may include as transparent conductive oxide one of the following materials or be formed in this way: for example metal oxides: for example zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped or be hole-conducting (p-TCO), or electron-conducting (n-TCO).

The first electrode 310 may include a layer or a layer stack of a plurality of layers of the same material or different materials. The first electrode 310 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

The first electrode 304 can have for example a layer thickness in a range of 10 nm to 500 nm, for example of less than 25 nm to 250 nm, for example of 50 nm to 100 nm.

The first electrode 310 can have a first electrical terminal, to which a first electrical potential can be applied. The first electrical potential can be provided by an energy source, for example a current source or a voltage source. Alternatively, the first electrical potential can be applied to an electrically conductive carrier 302 and the first electrode 310 can be electrically supplied indirectly through the carrier 302. The first electrical potential can be for example the ground potential or some other predefined reference potential.

FIG. 3 illustrates an optoelectronic component 300 including a first organic functional layer structure unit 316 and a second organic functional layer structure unit 320. In various embodiments, the organic functional layer structure 312 can also include more than two organic functional layer structures, for example 3, 4, 5, 6, 7, 8, 9, 10, or even more, for example 15 or more, for example 70.

The first organic functional layer structure unit 316 and the optionally further organic functional layer structures can be formed identically or differently, for example include an identical or different emitter material. The second organic functional layer structure unit 320, or the further organic functional layer structure units can be formed like one of the below-described configurations of the first organic functional layer structure unit 316.

The first organic functional layer structure unit 316 may include a hole injection layer, a hole transport layer, an emitter layer, an electron transport layer and an electron injection layer.

In an organic functional layer structure unit 312, one or a plurality of the layers mentioned can be provided, wherein identical layers can have a physical contact, can be only electrically connected to one another or can even be formed in a manner electrically insulated from one another, for example can be formed alongside one another. Individual layers of the layers mentioned can be optional.

A hole injection layer can be formed on or above the first electrode 310. The hole injection layer may include or be formed from one or a plurality of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB (N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD (N,N'-bis(3-methylphenyl)-N,N'-bis(phenyl)-9,9-dimethylfluorene);

DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis-(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-ylamino)phenyl]-9H-fluorene; 9, 9-bis[4-(N,N-bisnaphthalen-2-ylamino)phenyl]-9H-fluorene; 9, 9-bis[4-(N,N'-bisnaphthalen-2-yl-N,N'-bisphenylamino)phenyl]-9H-fluorene; N,N'-bis(phenanthren-9-yl)-N,N'-bis(phenyl) benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di[4-(N,N-di-tolylamino)phenyl] cyclohexane; 2,2',7,7'-tetra(N,N-di-tolyl) aminospirobifluorene; and/or N,N,N',N'-tetranaphthalen-2-ylbenzidine.

The hole injection layer can have a layer thickness in a range of approximately 10 nm to approximately 1000 nm, for example in a range of approximately 30 nm to approximately 300 nm, for example in a range of approximately 50 nm to approximately 200 nm.

A hole transport layer can be formed on or above the hole injection layer. The hole transport layer may include or be formed from one or a plurality of the following materials: NPB (N,N'-bis(naphthalen-1-yl)-N,N'-bis(phenyl)benzidine); beta-NPB (N,N'-bis(naphthalen-2-yl)-N,N'-bis(phenyl)-benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-ylamino)phenyl]-9H-fluorene; 9, 9-bis[4-(N,N-bisnaphthalen-2-ylamino)phenyl]-9H-fluorene; 9, 9-bis[4-(N,N'-bisnaphthalen-2-yl-N,N'-bisphenylamino)phenyl]-9H-fluorene; N,N'-bis(phenanthren-9-yl)-N,N'-bis(phenyl) benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di[4-(N,N-ditolyl-amino)phenyl] cyclohexane; 2,2',7,7'-tetra(N,N-ditolyl) aminospirobifluorene; and N,N,N',N'-tetranaphthalen-2-ylbenzidine, a tertiary amine, a carbazole derivative, a conductive polyaniline and/or polyethylene dioxythiophene.

The hole transport layer can have a layer thickness in a range of approximately 5 nm to approximately 50 nm, for example in a range of approximately 10 nm to approximately 30 nm, for example approximately 20 nm.

An emitter layer can be formed on or above the hole transport layer. Each of the organic functional layer structure units 316, 320 may include in each case one or a plurality of emitter layers, for example including fluorescent and/or phosphorescent emitters.

An emitter layer may include or be formed from organic polymers, organic oligomers, organic monomers, organic small, non-polymeric molecules ("small molecules") or a combination of these materials.

The optoelectronic component 300 may include or be formed from one or a plurality of the following materials in an emitter layer: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl)iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl) amino]anthracene) and red fluorescent DCM2 (4-dicyanomethylene)-2-methyl-6-julolidyl-9-enyl-4H-pyran) as non-polymeric emitters.

Such non-polymeric emitters can be deposited for example by means of thermal evaporation. Furthermore, polymer emitters can be used which can be deposited for example by means of a wet-chemical method, such as, for example, a spin-coating method.

The emitter materials can be embedded in a suitable manner in a matrix material, for example a technical ceramic or a polymer, for example an epoxy; or a silicone.

In various embodiments, the emitter layer can have a layer thickness in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red). Alternatively, the emitter layer may include a plurality of partial layers which emit light of different colors. By means of mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure unit 316 may include one or a plurality of emitter layers embodied as hole transport layer.

Furthermore, the organic functional layer structure unit 316 may include one or a plurality of emitter layers embodied as electron transport layer.

An electron transport layer can be formed, for example deposited, on or above the emitter layer.

The electron transport layer may include or be formed from one or a plurality of the following materials: NET-18; 2,2',2''-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di (naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris (2,4,6-trimethyl-3-(pyridin-3-yl)phenyl)borane; 1-methyl-2-(4-(naphthalen-2-yl)phenyl)-1H-imidazo[4,5-f] [1, 10] phenanthroline; phenyldipyrenylphosphine oxide; naphthalenetetracarboxylic dianhydride or the imides thereof;

perylenetetracarboxylic dianhydride or the imides thereof; and substances based on silols including a silacyclopentadiene unit.

The electron transport layer can have a layer thickness in a range of approximately 5 nm to approximately 50 nm, for example in a range of approximately 10 nm to approximately 30 nm, for example approximately 20 nm.

An electron injection layer can be formed on or above the electron transport layer. The electron injection layer may include or be formed from one or a plurality of the following materials: NDN-26, MgAg, $Cs_2CO_3$, $Cs_3PO_4$, Na, Ca, K, Mg, Cs, Li, LiF; 2,2′,2″-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2′-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6′-bis[5-(biphenyl-4-yl)-1,3,4-oxadiazo-2-yl]-2,2′-bipyridyl; 2-phenyl-9,10-di(naphthalen-2-yl)anthracene; 2,7-bis[2-(2,2′-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f] [1, 10] phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer can have a layer thickness in a range of approximately 5 nm to approximately 200 nm, for example in a range of approximately 20 nm to approximately 50 nm, for example approximately 30 nm.

In the case of an organic functional layer structure 312 including two or more organic functional layer structure units 316, 320, the second organic functional layer structure unit 320 can be formed above or alongside the first functional layer structure units 316. An intermediate layer structure 318 can be formed electrically between the organic functional layer structure units 316, 320.

In various embodiments, the intermediate layer structure 318 can be formed as an intermediate electrode 318, for example in accordance with one of the configurations of the first electrode 310. An intermediate electrode 318 can be electrically connected to an external voltage source. The external voltage source can provide a third electrical potential, for example at the intermediate electrode 318. However, the intermediate electrode 318 can also have no external electrical connection, for example by the intermediate electrode having a floating electrical potential.

In various embodiments, the intermediate layer structure 318 can be formed as a charge generating layer structure 318 (charge generation layer CGL). A charge generating layer structure 318 may include one or a plurality of electron-conducting charge generating layer(s) and one or a plurality of hole-conducting charge generating layer(s). The electron-conducting charge generating layer(s) and the hole-conducting charge generating layer(s) can be formed in each case from an intrinsically conductive substance or a dopant in a matrix. The charge generating layer structure 318 should be formed, with respect to the energy levels of the electron-conducting charge generating layer(s) and the hole-conducting charge generating layer(s), in such a way that electron and hole can be separated at the interface between an electron-conducting charge generating layer and a hole-conducting charge generating layer. The charge generating layer structure 318 can furthermore have a diffusion barrier between adjacent layers.

Each organic functional layer structure unit 316, 320 can have for example a layer thickness of a maximum of approximately 3 µm, for example a layer thickness of a maximum of approximately 1 µm, for example a layer thickness of a maximum of approximately 300 nm.

The optoelectronic component 300 can optionally include further organic functional layers, for example arranged on or above the one or the plurality of emitter layers or on or above the electron transport layer(s). The further organic functional layers can be for example internal or external coupling-in/extraction structures that further improve the functionality and thus the efficiency of the optoelectronic component 300.

The second electrode 314 can be formed on or above the organic functional layer structure 312 or, if appropriate, on or above the one or the plurality of further organic functional layer structures and/or organic functional layers.

The second electrode 314 can be formed in accordance with one of the configurations of the first electrode 310, wherein the first electrode 310 and the second electrode 314 can be formed identically or differently. The second electrode 314 can be formed as an anode, that is to say as a hole-injecting electrode, or as a cathode, that is to say as an electron-injecting electrode.

The second electrode 314 can have a second electrical terminal, to which a second electrical potential can be applied. The second electrical potential can be provided by the same energy source as, or a different energy source than, the first electrical potential and/or the optional third electrical potential. The second electrical potential can be different than the first electrical potential and/or the optionally third electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The second barrier layer 308 can be formed on the second electrode 314.

The second barrier layer 308 can also be referred to as thin film encapsulation (TFE). The second barrier layer 308 can be formed in accordance with one of the configurations of the first barrier layer 304.

Furthermore, it should be pointed out that, in various embodiments, a second barrier layer 308 can also be entirely dispensed with. In such a configuration, the optoelectronic component 300 may include for example a further encapsulation structure, as a result of which a second barrier layer 308 can become optional, for example a cover 324, for example a cavity glass encapsulation or metallic encapsulation.

Furthermore, in various embodiments, in addition, one or a plurality of coupling-in/extracting layers can also be formed in the optoelectronic component 300, for example an external extracting film on or above the carrier 302 (not illustrated) or an internal extracting layer (see FIG. 2), for example by means of the glassware 200. As described above, the coupling-in/extracting layer 206 may include a glass matrix 204 and particles 208/210 distributed therein, wherein the mean refractive index of the coupling-in/extracting layer 206 is greater or less than the mean refractive index of the layer from which the electromagnetic radiation is provided. Furthermore, in various embodiments, in addition, one or a plurality of antireflection layers (for example combined with the second barrier layer 308) can be provided in the optoelectronic component 300.

In various embodiments, a coupling layer is realized by means of the particles of the first type and/or of the second type in the glass matrix, for example by virtue of the particles of the second type being exposed on the incidence side for the electromagnetic radiation. The coupling layer can be formed for example as a coupling-in layer and/or an extraction layer.

In one configuration, the coefficient of thermal expansion of the particles 208/210 of the first type and/or of the second type and the coefficient of thermal expansion of the glass matrix can be matched to one another, for example by a suitable material selection, for example within a range of approximately 50%, for example within a range of approximately 40%, for example within a range of approximately 30%, for example within a range of approximately 20%, for example within a range of approximately 10%, for example approximately equal relative to the coefficient of thermal expansion of the glass matrix. By way of example, the particles of the first and/or the second type can be a glass, that is to say can be formed in an amorphous fashion.

In one configuration, the coupling layer 206 can have a mean refractive index of at least approximately 1.5, for example a refractive index of at least approximately 1.6, for example a refractive index of at least approximately 1.65, for example a range of approximately 1.7 to approximately 2.1.

In one configuration, the coupling layer can have a thickness in a range of approximately 100 nm to approximately 100 μm. for example in a range of approximately 1 μm to approximately 10 μm, for example approximately 2.5 μm.

In one configuration, the particles of the first and/or the second type and/or luminophore particles can have a curved surface, for example in a manner similar or identical to an optical lens. Additionally or alternatively, the particles can have one of the following geometrical shapes and/or a part of one of the following geometrical shapes or can be formed in this way: spherical, aspherical, for example prismatic, ellipsoid, hollow, compact, laminar or rod-shaped.

In one configuration, the particles of the first and/or second type and/or luminophore particles in the glass matrix may include a ply having a thickness of approximately 0.1 μm to approximately 100 μm. In one configuration, the particles of the first and/or second type and/or luminophore particles of the coupling layer 206 may include a plurality of plies one above another in the glass matrix, wherein the individual plies can be formed differently.

In one configuration, the particles of the first and/or second type and/or luminophore particles can scatter electromagnetic radiation, absorb UV radiation, convert the wavelength of electromagnetic radiation, color the coupling layer and/or bind harmful substances. Particles of the first and/or second type and/or luminophore particles which for example can scatter electromagnetic radiation and cannot absorb UV radiation may include or be formed from, for example, $Al_2O_3$, $SiO_2$, $Y_2O_3$ or $ZrO_2$. Particles of the first and/or second type and/or luminophore particles which for example scatter electromagnetic radiation and convert the wavelength of electromagnetic radiation can be designed for example as glass particles including a luminophore.

In one configuration, the coupling layer 206 can be structured, for example topographically, for example laterally and/or vertically; for example by means of a different material composition and distribution of the particles of the coupling layer 206, for example laterally and/or vertically, for example with a different local concentration of at least one type of the particles of the first and/or second type, and/or luminophore particles.

The structured interface can be formed for example by means of roughening one of the surfaces or forming a pattern at a surface of the glass matrix. In one configuration, the structured surface can be formed by microlenses. The microlenses and/or the interface roughness can for example also be understood as scattering centers and be formed for example by means of the second particles, for example in order to increase the light coupling-in/light extraction. In one configuration, the coupling layer 206 can be formed as a grating, wherein the grating includes a structured layer including regions having a low refractive index.

In various embodiments, a close connection layer 322, for example composed of an adhesive or a lacquer, can be provided on or above the second barrier layer 308. By means of the close connection layer 322, a cover 324 can be closely connected, for example adhesively bonded, on the second barrier layer 308.

A close connection layer 322 composed of a transparent material may include for example particles which scatter electromagnetic radiation, for example light-scattering particles. As a result, the close connection layer 322 can act as a scattering layer and lead to an improvement in the color angle distortion and the extraction efficiency.

The light-scattering particles provided can be dielectric scattering particles, for example composed of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the close connection layer 322, for example air bubbles, acrylate, or hollow glass beads. Furthermore, by way of example, metallic nanoparticles, metals such as gold, silver, iron nanoparticles, or the like can be provided as light-scattering particles.

The close connection layer 322 can have a layer thickness of greater than 1 μm, for example a layer thickness of a plurality of μm. In various embodiments, the close connection layer 322 may include or be a lamination adhesive.

The close connection layer 322 can be designed in such a way that it includes an adhesive having a refractive index that is less than the refractive index of the cover 324. Such an adhesive can be for example a low refractive index adhesive such as, for example, an acrylate having a refractive index of approximately 1.3. However, the adhesive can also be a high refractive index adhesive which for example includes high refractive index, non-scattering particles and has a layer-thickness-averaged refractive index that approximately corresponds to the average refractive index of the organic functional layer structure 312, for example in a range of approximately 1.7 to approximately 2.0. Furthermore, a plurality of different adhesives can be provided which form an adhesive layer sequence.

In various embodiments, between the second electrode 314 and the close connection layer 322, an electrically insulating layer (not shown) can also be applied, for example SiN, for example having a layer thickness in a range of approximately 300 nm to approximately 1.5 μm, for example having a layer thickness in a range of approximately 500 nm to approximately 1 μm, in order to protect electrically unstable materials, during a wet-chemical process for example.

In various embodiments, a close connection layer 322 can be optional, for example if the cover 324 is formed directly on the second barrier layer 308, for example a cover 324 composed of glass that is formed by means of plasma spraying.

Furthermore, a so-called getter layer or getter structure, for example a laterally structured getter layer, can be arranged (not illustrated) on or above the electrically active region 306. The getter layer may include or be formed from a material that absorbs and binds substances that are harmful to the electrically active region 306. A getter layer may include or be formed from a zeolite derivative, for example. The getter layer can be formed as translucent, transparent or opaque and/or nontransmissive with respect to the electromagnetic radiation that is emitted and/or absorbed in the optically active region. The getter layer can have a layer thickness of greater than approximately 1 µm, for example a layer thickness of a plurality of µm. In various embodiments, the getter layer may include a lamination adhesive or be embedded in the close connection layer 322.

A cover 324 can be formed on or above the close connection layer 322. The cover 324 can be closely connected to the electrically active region 306 by means of the close connection layer 322 and can protect said region from harmful substances. The cover 324 can be for example a glass cover 324, a metal film cover 324 or a sealed plastics film cover 324. The glass cover 324 can be closely connected to the second barrier layer 308 or the electrically active region 306 for example by means of frit bonding (glass frit bonding/glass soldering/seal glass bonding) by means of a conventional glass solder in the geometric edge regions of the organic optoelectronic component 300.

The cover 324 and/or the close connection layer 322 can have a refractive index (for example at a wavelength of 633 nm) of 1.55.

In various embodiments, glassware described above can be used as a glass cover.

In various embodiments, glassware, glassware including luminophore particles, a device for producing glassware, a method for producing glassware and a method for producing glassware including luminophore particles are provided which make it possible, for example, to form the extraction structure and/or coupling-in structure of an optoelectronic component during the process for producing a carrier and/or a cover of the optoelectronic component.

The invention claimed is:

1. Glassware, comprising:
a glass matrix having a surface,
a first type of particles, and
at least one second type of particles, wherein the particles of the second type have a higher refractive index than the particles of the first type;
wherein the particles of the first type are completely surrounded by the glass matrix, such that the surface of the glass matrix is free of particles of the first type, and
the particles of the second type are arranged above and/or between the particles of the first type, at least partly in the glass matrix, and at the surface of the glass matrix in order to increase the refractive index of the glassware and the particles of the second type have a smaller mean particle size than the particles of the first type.

2. The glassware as claimed in claim 1,
wherein the glassware is formed such that it is at least translucent in the visible wavelength range of an electromagnetic radiation.

3. The glassware as claimed in claim 2,
wherein the glassware is formed such that it is transparent in the visible wavelength range of an electromagnetic radiation.

4. The glassware as claimed in claim 1,
wherein the glassware is formed as:
a flat glass;
a hollow glass; or
as a glass fiber.

5. The glassware as claimed in claim 1,
wherein the glass is a silicate glass.

6. The glassware as claimed in claim 1,
wherein the first type of particles has a refractive index in a range of approximately 1.5 to approximately 4.0, and
wherein the first type of particles has a mean diameter in a range of approximately 100 nm to approximately 50 µm, and
wherein the second type of particles has a mean diameter in a range of approximately 10 nm to approximately 1 µm.

7. The glassware as claimed in claim 1,
wherein the first type of particles and/or the second type of particles have/has one or more of the following optically functional properties with regard to the glass matrix and an electromagnetic radiation or are/is formed in this way:
non-scattering high-index particles,
scattering particles,
radiation-absorbing,
radiation-absorbing in the visible wavelength range of the electromagnetic radiation, and/or
wavelength-converting.

8. The glassware as claimed in claim 1,
wherein the glass matrix has a second surface situated opposite the first surface at a distance, wherein at the second surface:
particles of the first type are exposed and the second surface is free of particles of the second type; or
the second surface is free of particles of the first type and of the second type; or
the second surface is free of particles of the first type and particles of the second type are exposed at the second surface.

9. The glassware as claimed in claim 1,
wherein the ratio of the mean diameter of the particles of the second type to the mean diameter of the particles of the first type is in a range of $2 \cdot 10^{-4}$ to 0.1.

10. A method for producing glassware the glassware comprising:
a glass matrix having a surface,
a first type of particles, and
at least one second type of particles, wherein the particles of the second type have a higher refractive index than the particles of the first type;
wherein the particles of the first type are completely surrounded by the glass matrix, such that the surface of the glass matrix is free of particles of the first type, and
the particles of the second type are arranged above and/or between the particles of the first type at least partly in the glass matrix at the surface of the glass matrix in order to increase the refractive index of the glassware,
the method comprising:
providing a molten glass matrix having a surface,
distributing particles of a first type in the molten glass matrix through the surface in such a way that the particles of the first type are completely surrounded by the molten glass matrix, such that the surface of the glass matrix is free of particles of the first type;
distributing particles of a second type into the glass melt through the surface in such a way that the particles of the second type are arranged above and/or between the particles of the first type, at least partly in the glass matrix and at the surface of the glass matrix, and the particles of the second type have a smaller mean diameter than the particles of the first type.

11. An optoelectronic component comprising glassware, the glassware comprising:
a glass matrix having a surface,
a first type of particles, and
at least one second type of particles, wherein the particles of the second type have a higher refractive index than the particles of the first type, and the particles of the second type have a smaller mean particle size than the particles of the first type;
wherein the particles of the first type are completely surrounded by the glass matrix, such that the surface of the glass matrix is free of particles of the first type, and
the particles of the second type are arranged above and/or between the particles of the first type, at least partly in the glass matrix, and at the surface of the glass matrix in order to increase the refractive index of the glassware,
the optoelectronic component comprising:
an optically active region for converting an electric current into an electromagnetic radiation and/or converting an electromagnetic radiation into an electric current;
wherein the glassware is formed as a covering body of the optically active region and is arranged in the beam path of the electromagnetic radiation.

12. The optoelectronic component as claimed in claim 11, wherein the optoelectronic component is formed as a light emitting diode, a solar cell, a fluorescent tube, an incandescent lamp, a luminous tube or a halogen lamp, an organic optoelectronic component, an organic photodetector, an organic solar cell and/or an organic light emitting diode.

13. The optoelectronic component as claimed in claim 11, wherein the optically active region comprises a first electrode, a second electrode and an organic functional layer structure between the first electrode and the second electrode, wherein the organic functional layer structure is formed for converting the electromagnetic radiation and/or the electric current.

14. A method for producing an optoelectronic component, the optoelectronic component comprising glassware,
the glassware comprising:
a glass matrix having a surface,
a first type of particles, and
at least one second type of particles, wherein the particles of the second type have a higher refractive index than the particles of the first type;
wherein the particles of the first type are completely surrounded by the glass matrix, such that the surface of the glass matrix is free of particles of the first type, and
the particles of the second type are arranged above and/or between the particles of the first type, at least partly in the glass matrix, and at the surface of the glass matrix in order to increase the refractive index of the glassware and
the particles of the second type have a smaller mean diameter than the particles of the first type,
the optoelectronic component comprising:
an optically active region for converting an electric current into an electromagnetic radiation and/or converting an electromagnetic radiation into an electric current;
wherein the glassware is formed as a covering body of the optically active region and is arranged in the beam path of the electromagnetic radiation,
the method comprising:
forming an optically active region on or above the glassware and/or applying the glassware on, above and/or around the optically active region;
wherein the glassware is arranged as an extraction structure and/or coupling-in structure with regard to the electromagnetic radiation absorbed or emitted by the optically active region in the beam path of the electromagnetic radiation.

* * * * *